(12) United States Patent
Tan et al.

(10) Patent No.: US 7,322,287 B2
(45) Date of Patent: Jan. 29, 2008

(54) APPARATUS FOR FLUID PRESSURE IMPRINT LITHOGRAPHY

(75) Inventors: Hua Tan, South Bound Brook, NJ (US); Linshu Kong, Plainsboro, NJ (US); Mingtao Li, Boise, ID (US); Stephen Y. Chou, Princeton, NJ (US)

(73) Assignee: Nanonex Corporation, Princeton, NJ (US)

( * ) Notice: Subject to any disclaimer, the term of this patent is extended or adjusted under 35 U.S.C. 154(b) by 0 days.

(21) Appl. No.: 10/926,376

(22) Filed: Aug. 25, 2004

(65) Prior Publication Data
US 2005/0145119 A1 Jul. 7, 2005

Related U.S. Application Data

(60) Continuation-in-part of application No. 10/140,140, filed on May 7, 2002, now Pat. No. 7,137,803, which is a division of application No. 09/618,174, filed on Jul. 18, 2000, now Pat. No. 6,482,742.

(60) Provisional application No. 60/497,850, filed on Aug. 25, 2003.

(51) Int. Cl.
*H01L 21/302* (2006.01)
(52) U.S. Cl. .................. 101/28; 101/483; 438/20; 438/690; 438/945; 425/385; 425/405.1; 264/571
(58) Field of Classification Search .......... 438/20, 438/22, 690, 945; 425/385, 388, 405.1; 264/101, 264/293, 571; 156/320; 101/28, 483

See application file for complete search history.

(56) References Cited

U.S. PATENT DOCUMENTS

| 5,947,027 | A | * | 9/1999 | Burgin et al. ................ 101/474 |
| 5,993,189 | A | * | 11/1999 | Mueller et al. ........... 425/405.1 |
| 6,062,133 | A | * | 5/2000 | Blalock ....................... 100/211 |
| 6,190,929 | B1 | * | 2/2001 | Wang et al. .................. 438/20 |
| 6,429,443 | B1 | * | 8/2002 | Mankos et al. ......... 250/492.24 |
| 6,482,742 | B1 | * | 11/2002 | Chou .......................... 438/690 |
| 2003/0006529 | A1 | * | 1/2003 | Ho et al. ............... 264/272.15 |
| 2006/0043626 | A1 | * | 3/2006 | Wu et al. ................... 264/101 |

FOREIGN PATENT DOCUMENTS

WO  WO 01/42858 A1 * 6/2001

* cited by examiner

*Primary Examiner*—Daniel J. Colilla
*Assistant Examiner*—Kevin D. Williams
(74) *Attorney, Agent, or Firm*—Polster, Lieder, Woodruff & Lucchesi, LC

(57) ABSTRACT

Improved apparatus for imprint lithography involves using direct fluid pressure to press a mold into a substrate-supported film. Advantageously the mold and/or substrate are sufficiently flexible to provide wide area contact under the fluid pressure. Fluid pressing can be accomplished by sealing the mold against the film and disposing the resulting assembly in a pressurized chamber. The result of this fluid pressing is enhanced resolution and high uniformity over an enlarged area.

23 Claims, 13 Drawing Sheets

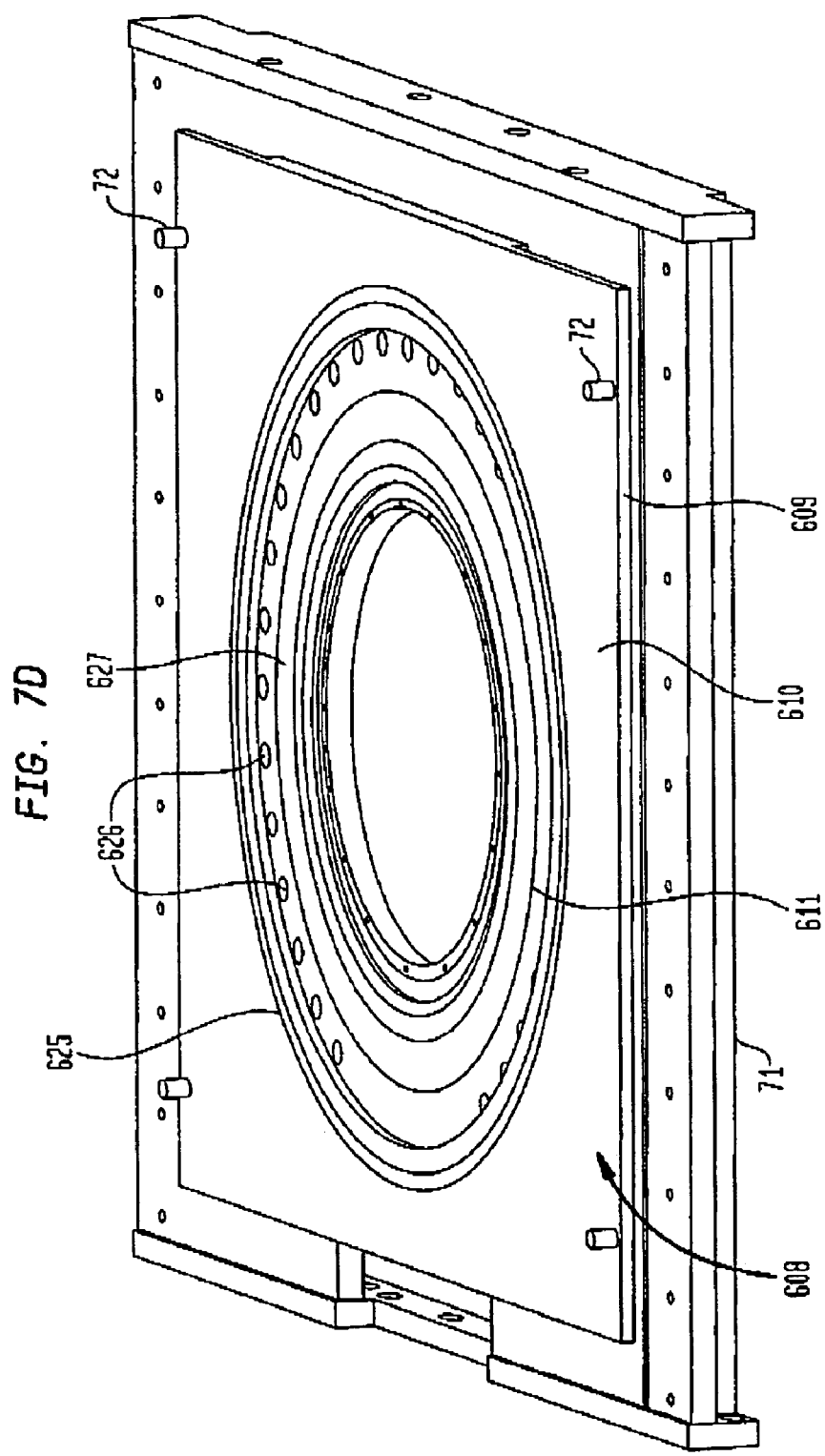

APPARATUS FOR FLUID PRESSURE IMPRINT LITHOGRAPHY

CROSS REFERENCE TO RELATED APPLICATIONS

This application claims the benefit of U.S. Provisional Patent Application Ser. No. 60/497,850 of similar title filed by H. Tan et al. on Aug. 25, 2003, which is incorporated herein by reference.

This application is also a continuation-in-part of U.S. patent application Ser. No. 10/140,140 filed May 7, 2002 now U.S. Pat. No. 7,137,803, and entitled "Fluid Pressure Imprint Lithography". Ser. No. 10/140,140, in turn, is a divisional of U.S. patent application Ser. No. 09/618,174 filed Jul. 18, 2000 (now U.S. Pat. No. 6,482,742 issued Nov. 19, 2002). The foregoing '140 application, '174 application and '742 patent are each incorporated herein by reference.

This application is also related to U.S. patent application Ser. No. 10/637,838 filed by Stephen Chou on Aug. 8, 2003 and entitled "Lithographic Apparatus For Fluid Pressure Imprint Lithography", which is incorporated herein by reference.

FIELD OF THE INVENTION

This invention relates to apparatus for performing imprint lithography wherein direct fluid pressure is used to press a mold into a thin film. The apparatus is particularly useful to provide nanoimprint lithography of enhanced resolution and uniformity over an increased area.

BACKGROUND OF THE INVENTION

Lithography is a key process in the fabrication of semiconductor integrated circuits and many optical, magnetic and micromechanical devices. Lithography creates a pattern on a thin film carried on a substrate so that, in subsequent process steps, the pattern can be replicated in the substrate or in another material which is added onto the substrate.

Conventional lithography typically involves applying a thin film of resist to a substrate, exposing the resist to a desired pattern of radiation, and developing the exposed film to produce a physical pattern. In this approach, resolution is limited by the wavelength of the radiation, and the equipment becomes increasingly expensive as the feature size becomes smaller.

Nanoimprint lithography, based on a fundamentally different principle offers high resolution, high throughput, low cost and the potential of large area coverage. In nanoimprint lithography, a mold with nanoscale features is pressed into a thin film, deforming the shape of the film according to the features of the mold and forming a relief pattern in the film. After the mold is removed, the thin film can be processed to remove the reduced thickness portions. This removal exposes the underlying substrate for further processing. Details of nanoimprint lithography are described in applicant's U.S. Pat. No. 5,772,905 issued Jun. 30, 1998 and entitled "Nanoimprint Lithography". The '905 patent is incorporated herein by reference.

The usual method of pressing the mold into the thin film involves positioning the mold and the substrate on respective rigid plates of a high precision mechanical press. With such apparatus, the process can generate sub-25 nm features with a high degree of uniformity over areas on the order of 12 in$^2$. Larger areas of uniformity would be highly advantageous to increase throughput and for many applications such as displays.

SUMMARY OF THE INVENTION

Improved apparatus for imprint lithography uses direct fluid pressure to press a mold into a substrate-supported film. Advantageously the mold and/or substrate are sufficiently flexible to provide wide area contact under the fluid pressure. Fluid pressing can be accomplished by sealing the mold against the film and disposing the resulting assembly in a pressurized chamber. The result of this fluid pressing is enhanced resolution and high uniformity over an enlarged area.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIGS. 7A, 7B, 7C and 7D illustrate assembly stage apparatus for practicing the method of FIG. 1;

It is to be understood that these drawing are for purposes of illustrating the concepts of the invention and are not to scale.

DETAILED DESCRIPTION

The use of a high precision mechanical press to press a mold into a thin film presents tolerance problems in replicating small patterns over large areas. Presses move on guide shafts through apertures, and the spacings between the shafts and their respective apertures can be large compared to the features to be replicated. Such spacings permit undesirable relative translational and rotational shifts between the substrate and the mold. Moreover, despite the most careful construction, the molds and the substrates are not perfectly planar. When these molds and substrates are disposed on the rigid plates of a press, the deviations from planarity over large areas can result in variations in the molding pressure and the depth of imprint. Accordingly, it is desirable to provide a method of imprint lithography which avoids the limitations of mechanical presses.

In accordance with the invention, unwanted lateral movements of mechanical presses are ameliorated by using direct fluid pressure to press together the mold and the moldable surface. The inventive methods apply fluid pressure over a surface of the mold, the substrate supporting the moldable surface or both. Because the fluid pressure is isostatic, no significant unbalanced lateral forces are applied. Direct fluid pressure also includes fluid pressure transmitted to the mold or substrate via a flexible membrane, as the membrane does not interfere with the transmission of isostatic pressure from the fluid. And streaming pressurized fluid from numerous openings in a pressure vessel can also apply nearly isostatic direct fluid pressure on the mold or substrate.

It is contemplated that the invention will have important applications in the molding of a pattern on a previously patterned substrate. The mold can be aligned with the previous pattern using conventional alignment techniques, and imprinting by direct fluid pressure minimizes any relative lateral shifts with consequent improvement in the alignment of the two patterns.

This description is divided into two parts: Part I describes the method of fluid pressure imprint lithography, and Part II describes apparatus for performing the method.

I. Fluid Pressure Imprint Lithography

Figure 1:
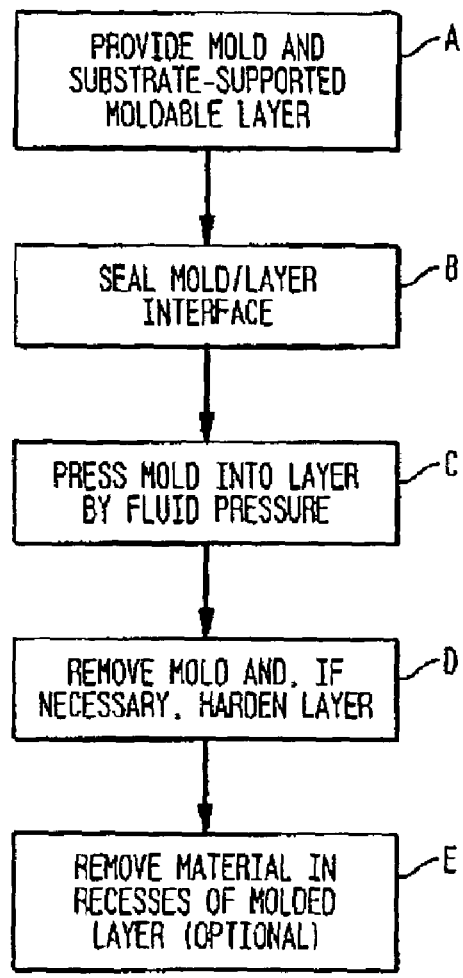
FIG. 1 is a schematic flow diagram of the steps in an improved method of imprint lithography.

Referring to the drawings, FIG. 1 is a schematic flow diagram of an improved process for imprint lithography using direct fluid pressure. An initial step shown in Block A, is to provide a mold having a plurality of protruding features and a substrate-supported thin film of moldable material. The protruding features are preferably micrometer scale features and, more advantageously, nanoscale features. The method is highly advantageous where the mold surface has at least two protruding features spaced apart by at least one lateral dimension less than 200 nm. Indeed patterns can be imprinted with features having a minimum lateral dimension of less than 25 nanometers. A moldable material is one which retains, or can be hardened to retain, the imprint of protruding features from the mold surface.

Figure 2:
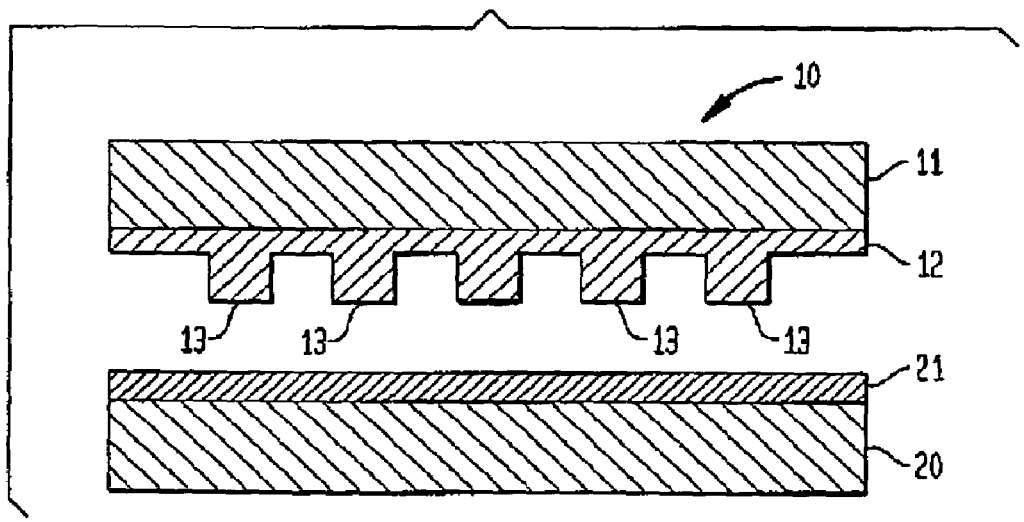
FIG. 2 illustrates a typical mold and a substrate bearing a moldable film for use in the improved method of FIG. 1.

FIG. 2 illustrates a typical mold 10 with protruding features and a substrate 20 bearing a moldable thin film. 21 provided for use in the process of FIG. 1. The mold comprises a body 11 and a molding layer 12 (which can be integral with body 11) including a plurality of protruding features 13 having a desired shape. The mold body 11 and the molding layer 12 are typically fused quartz, glass or ceramic. They can alternatively comprise metals, semiconductors, polymers or combinations thereof including multilayer structures. The mold body can be transparent, partially transparent or opaque. The molding layer 12 can be patterned into features 13 of using lithography techniques well known in the art, such as electron beam lithography, focused ion beam lithography, photolithography, laser beam writing or interference lithography. The thickness of layer 21 is typically in the range 0.1 nm-10 μm, and the extent of protruding features 13 (mold depth) is typically in the range 0.1 nm-10 μm and is advantageously less than 250 nanometers.

The substrate 20 typically comprises a semiconductor wafer such as a substantially planar wafer of monocrystalline silicon. The substrate could also be plastic, glass, ceramic polymer or metal. The moldable thin film 21 (which can be integral with substrate 20) can be any material that is on can be made pliable to pressure and can harden to retain a pressure-imprinted deformation or pattern. It can, for example, be a thermoplastic polymer, such as polycarbonate or polymethyl methacrylate (PMMA), which temporarily softens in response to heat. Alternatively it can be a liquid, such as a UV-curable silicone, which hardens in response to radiation or a liquid which cures with heat. It can also be a composite layer of polymer and hardenable liquid or a composite layered structure. The thin film is typically applied to the substrate by spraying or spinning. Advantageously the film does not adhere to the mold surface. If necessary, at least a portion of a protruding mold surface can be coated with a release agent to prevent such adherence. A preferred release agent comprises an inorganic linking group bonded to the mold surface and to a molecular chain having release properties as described in U.S. Pat. No. 6,309,580 issued to Stephen Chou on Oct. 30, 2001, which is incorporated herein by reference. The coating can be discontinuous.

In high resolution applications, the mold and the substrate are advantageously made of the same material or of materials having similar coefficients of thermal expansion in order to minimize misalignment due to differential thermal expansion or contraction.

Preferably the mold body 11 or the substrate 20 (or both) is flexible so that, under the force of fluid pressure, the surfaces of the mold and the substrate will conform despite deviations from planarity. Silicon substrates of thickness less than 2 mm exhibit such flexibility for typical imprint pressures.

The next step, shown in Block B, is to place the mold and the thin-film adjacent and to seal the interface of the mold with the thin film, forming a mold/film assembly. If the thin film already includes a previously formed pattern, then the pattern of the mold should be carefully aligned with the previous pattern on the film in accordance with techniques well known in the art. The sealing is to permit external fluid pressure to press the mold into the film. The sealing can be effected in a variety of ways such as by providing a ring of material, e.g. an elastomeric gasket, around the area to be molded and peripherally clamping the assembly.

The third step (Block C) is to press the mold into the film by direct fluid pressure. One method for doing this is to dispose the assembly in a pressure vessel and to introduce pressurized fluid into the vessel. The advantage of fluid pressure is that it is isostatic. The resulting force uniformly pushes the mold into the thin film. Shear or rotational components are de minimus. Moreover since the mold and/or substrate are flexible rather than rigid, conformation between the mold and the film is achieved regardless of unavoidable deviations from planarity. The result is an enhanced level of molding resolution, alignment and uniformity over an increased area of the film. The pressurized fluid can be gas or liquid. Pressurized air is convenient and typical pressures are in the range 1-1000 psi. The fluid can be heated, if desired, to assist in heating the moldable thin film. Cooled fluid can be used to cool the film.

Figure 3:
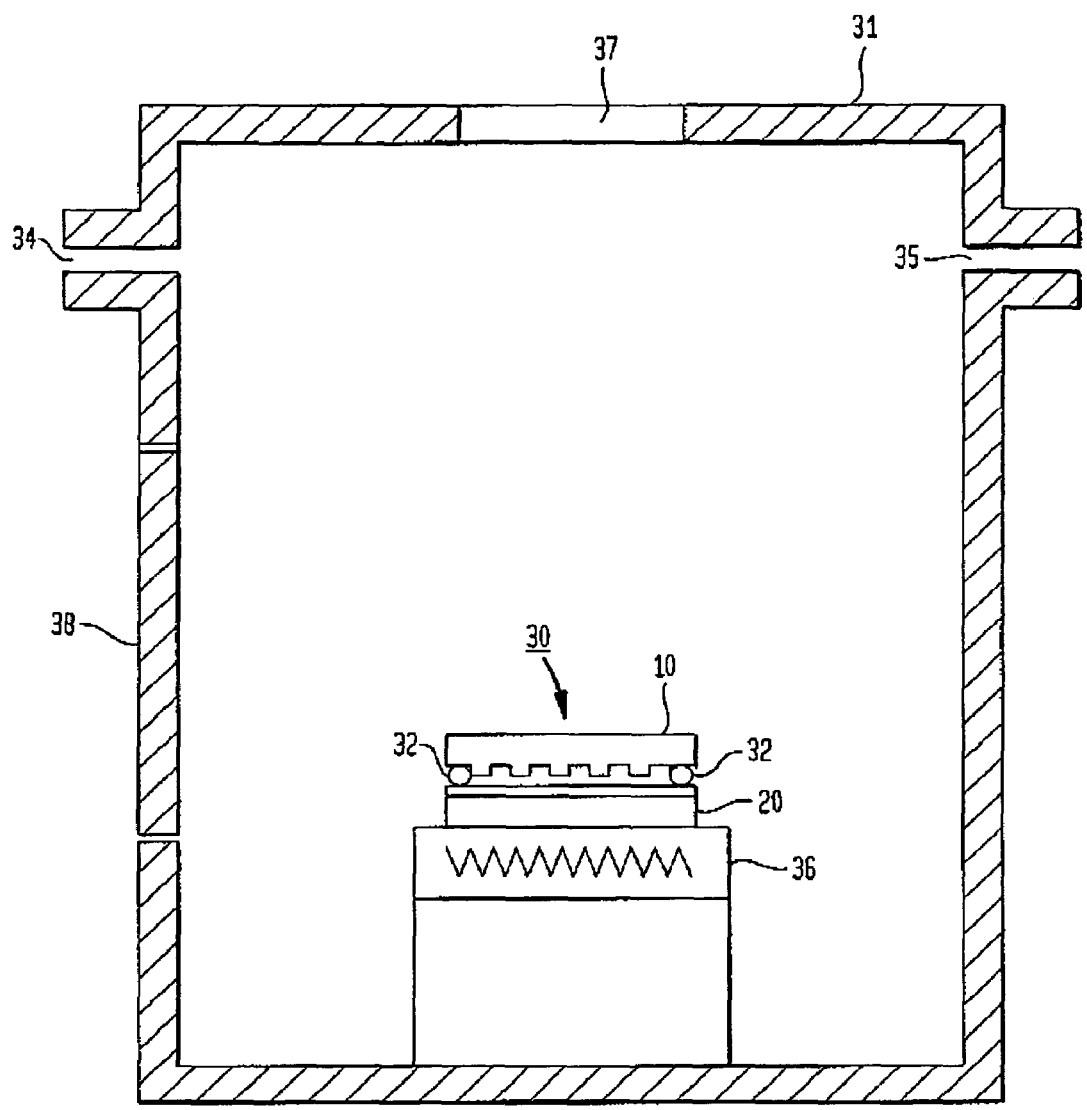
FIG. 3 illustrates apparatus for practicing the improved method of FIG. 1.

FIG. 3 illustrates a sealed mold/film assembly 30 disposed within a pressure vessel 31. The assembly 30 is sealed by a peripheral elastomeric gasket 32, extending around the area to be molded. The periphery of the assembly can be lightly clamped by a clamp (not shown) to effectuate the seal. The vessel 31 preferably includes a valve-controlled inlet 34 for the introduction of pressurized fluid and a valve controlled outlet 35 for the exit of such fluid. The vessel 31 may optionally include a heater 36 for heating a thermoplastic or heat-curable thin film and/or a transparent window 37 for introducing radiation to cure or cross link the film. A scalable door 38 can provide access to the interior of the vessel.

The next step shown in Block D is to harden the moldable thin film, if necessary, so that it retains the imprint of the mold and to remove the mold. The process for hardening depends on the material of the thin film. Some materials will maintain the imprint with no hardening. Thermoplastic materials can be hardened by heating them prior to imprinting and permitting them to cool after imprint. PMMA, for example, can be suitably softened by heating to 200° C. prior to imprinting and hardened by cooling after imprint. Heat curable materials can be hardened by applying heat during imprint. The above-described heater 36 and/or the use of a heated pressurized fluid can effectuate such hardening. Radiation curable materials can be hardened by the application of radiation during imprint, such as photons, electrons or ions of suitable energy. Photonic radiation can be supplied through the window 37 of the pressure vessel. The mold can be made of transparent material to permit the radiation to reach the film. Alternatively, the substrate can be transparent and the window positioned to illuminate the film through the substrate. The hardenable material can be partially hardened before separation from the mold and further hardened by radiation or heat after separation. The advantage of this approach is that the partially hardened material is more easily separated from the mold.

The fifth step shown in Block E is optional in some applications. It is to remove contaminants (if any) and excess material from the recesses of the molded thin film. The molded film will have raised features and recesses. In many lithographic operations it is desirable to eliminate the material from the recesses so that the underlying substrate is exposed for further processing. This can be conveniently accomplished using reactive ion etching.

Figure 4A:
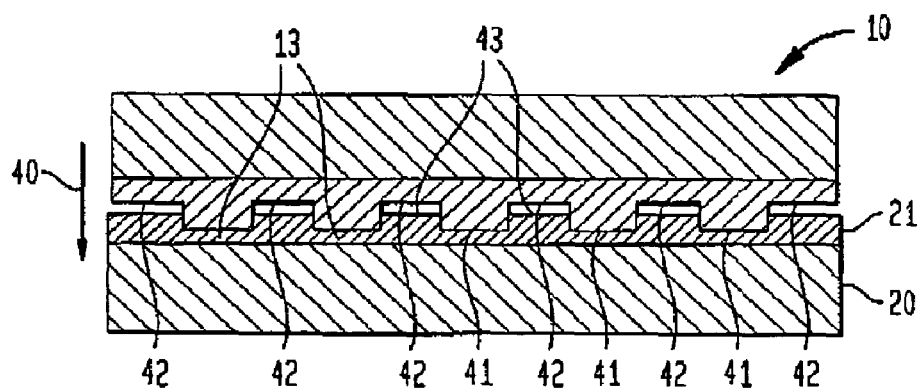
FIGS. 4A, 4B and 4C show the moldable layer and substrate at various stages of the process of FIG. 1.
Figure 4B:
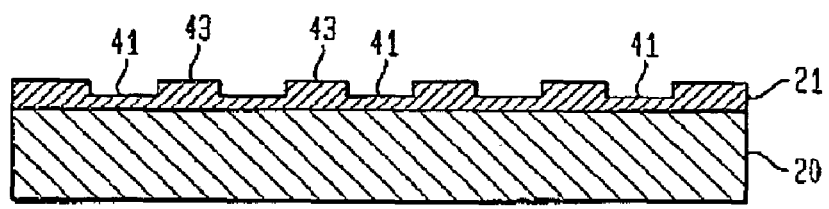
Figure 4C:
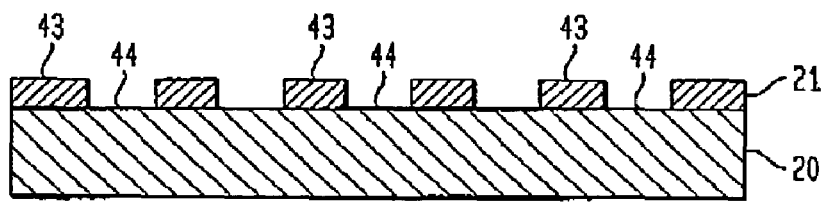

FIGS. 4A, 4B and 4C show the moldable layer and substrate at various stages of the process. FIG. 4A illustrates the layer 21 during imprinting by mold 10 pressed by fluid pressure in the direction of arrow 40. The protruding features 13 of the mold press into layer 21, producing thinned regions 41. The recessed regions 42 of the mold between successive protruding features leave layer 21 with regions 43 of greater thickness.

FIG. 4B shows the layer 21 after hardening and removal of the mold. The layer 21 retains the thinned regions 41 and thick regions 43 in accordance with the pattern imprinted by the mold.

FIG. 4C illustrates the layer and substrate after removal of the excess layer material in the recesses, exposing regions 44 of the substrate 20. The regions 44 can be nanoscale or larger.

In important applications the resulting structure is a resist-covered semiconductor substrate with a pattern of recesses extending to the substrate as shown in FIG. 4C. Such a structure can be further processed in a variety of ways well-known in the art. For example, the molded film (with material removed from the recesses) can be used as a mask for the further removal of surface layers in exposed regions 44 of the substrate, for doping the exposed regions or for growing or depositing materials on the exposed regions.

Figure 5A:
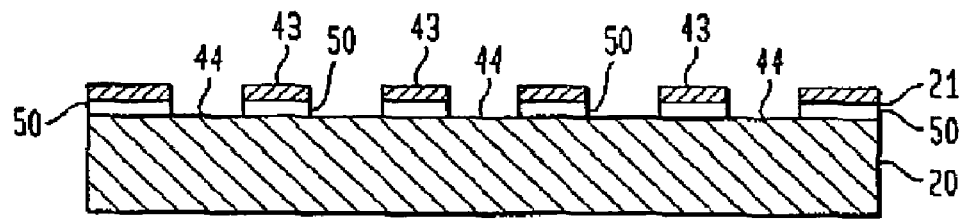
FIGS. 5A, 5B and 5C illustrate various further processing steps that can be performed on the substrate.
Figure 5B:
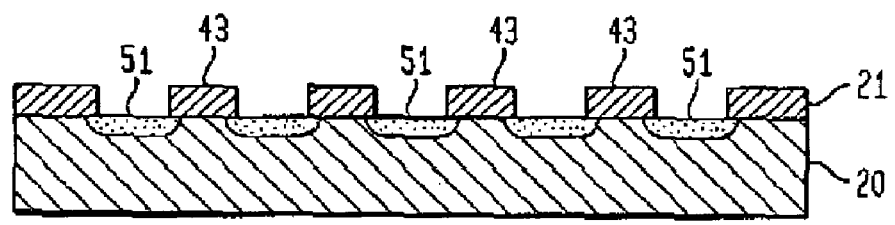
Figure 5C:
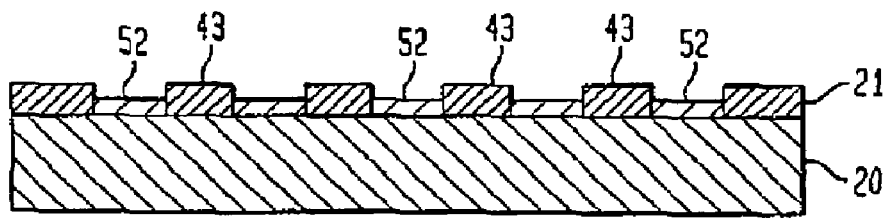

FIGS. 5A, 5B and 5C illustrate such further processing. In FIG. 5A, the substrate can include a surface dielectric layer 50 (such as SiO2 on Si) and the openings in the mask layer can permit removal of the dielectric at exposed regions 44. In FIG. 5B impurity regions 51 can be diffused or implanted into the semiconductor selectively in those regions 44 which are exposed, altering the local electrical or optical properties of the doped regions. Alternatively, as shown in FIG. 5C new material layers 52 such as conductors or epitaxial layers can be deposited or grown on the exposed substrate within the recesses. After such processing, the remaining material of the molded layer can be removed, if desired, using conventional techniques. PMMA, for example, can be cleaned away by washing with acetone. A substrate can be subjected to additional lithographic steps to complete a complex device such as an integrated circuit.

II. Apparatus For Fluid Pressure Imprint Lithography

We now turn to apparatus useful in performing the process of FIG. 1. There are a variety of ways of sealing the mold/film assembly 30 so that pressurized fluid will press the mold into the film. FIGS. 6A-6F illustrate several of these ways.

Figure 6A:
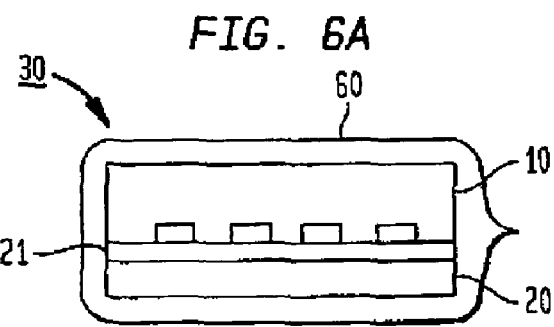
FIGS. 6A-6F illustrate alternative sealing arrangements useful in the Apparatus of FIG. 3.

FIG. 6A schematically illustrates an arrangement for sealing a mold/film assembly by disposing the assembly within a sealed covering of flexible, fluid-impermeable membrane 60 (e.g. a plastic bag). In this arrangement the region between the mold and the moldable layer is sealed in relation to an external pressure vessel. Preferably the air is removed from the bag before molding.

Figure 6B:
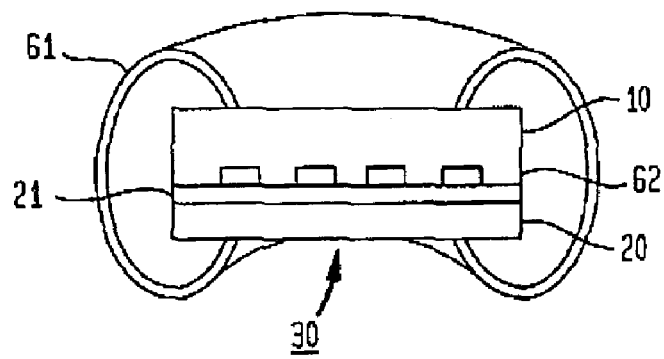

FIG. 6B shows an alternate sealing arrangement wherein the assembly 30 is sealed by a peripheral sealing clamp 61 which can be in the form of a hollow elastic toroid. Sealing can be assisted by providing the mold with a protruding region 62 extending around the region to be molded. In use, the clamp and pressurized fluid will press the protruding region 62 into the moldable film, sealing the molding region.

Figure 6C:
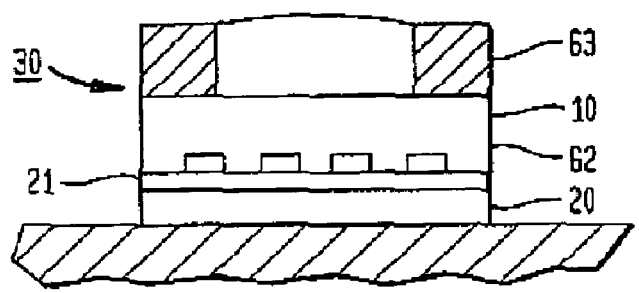

FIG. 6C illustrates a sealing arrangement in which the assembly 30 is sealed by applying a peripheral tube or weight 63 which lightly presses the mold onto the moldable film. A peripheral protruding region 62 can assist sealing.

Figure 6D:
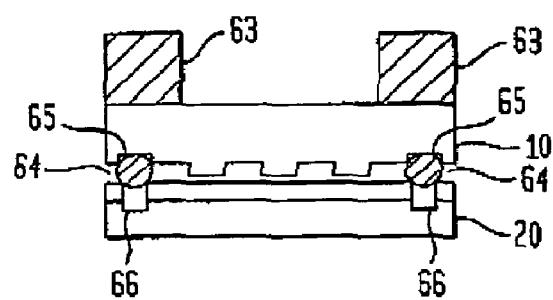

FIG. 6D shows an alternative sealing arrangement wherein the assembly 30 is sealed by a sealing O-ring 64 between the mold 10 and the substrate 20. Preferably the O-ring seats within peripheral recesses 65, 66 in the mold and the substrate, respectively. Light pressure from a peripheral tube or weight 63 can assist sealing.

Figure 6E:
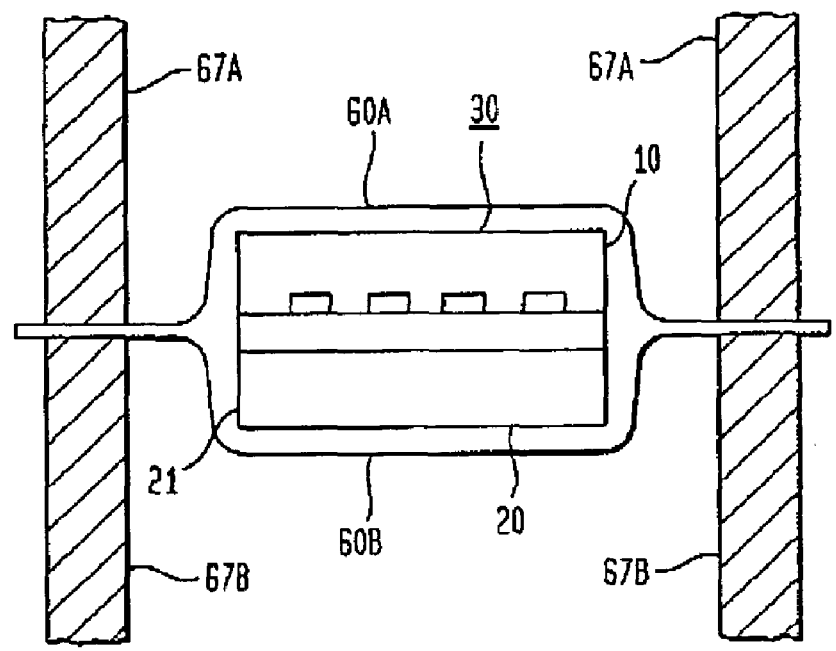

FIG. 6E shows yet another sealing arrangement in which the assembly 30 is disposed between flexible membranes 60A and 60B is enclosed within a pair of mating cylinders 67A, 67B. Application of fluid pressure to the interior of the cylinders presses the mold and moldable surface together. Alternatively, the two cylinders can lightly seal against the mold and the substrate, respectively, before pressurization. Yet further in the alternative, the substrate could rest upon a support and a single cylinder lightly seal against the mold or a membrane.

Figure 6F:
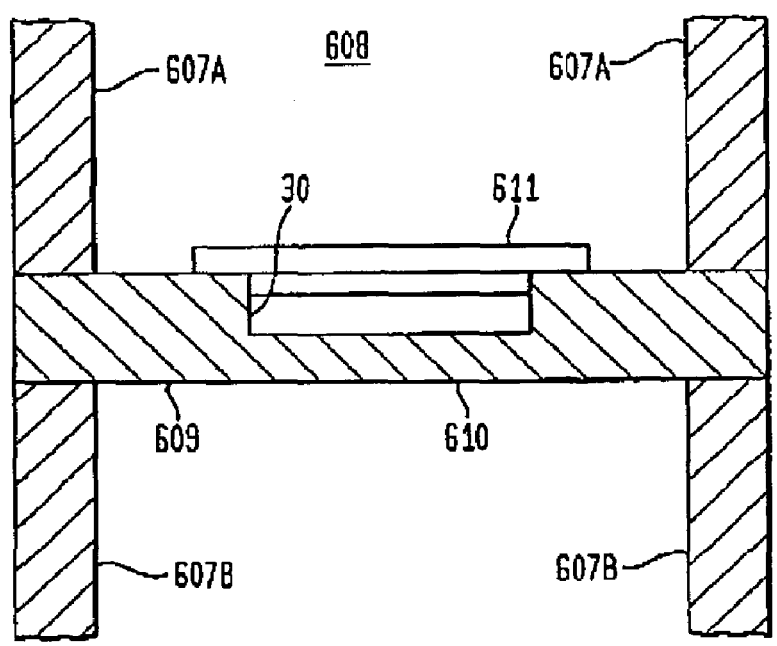

FIG. 6F shows a sealing arrangement similar to that of FIG. 6E wherein the assembly is 30 is supported within the chamber by an assembly stage 608. The assembly stage advantageously seals the interface between the molding surface and the moldable surface from the chamber. The stage 608 may include a rigid frame 609 supporting an assembly support 610 and a flexible sealing cover 611 overlying the assembly 30. The chamber can comprise mating cylinders 607A, 607B which seal against the rigid frame 609. Advantageously, the stage is laterally movable in relation to the axes of the cylinders so that the assembly 30 can be loaded into the stage outside the opened cylinders and the loaded stage can be laterally moved in position between the cylinders. The cylinders can then move axially into sealing engagement with the assembly stage. The assembly stage 608 can also be used with a conventional pressure chamber such as the vessel 31 of FIG. 3.

Figure 7A:
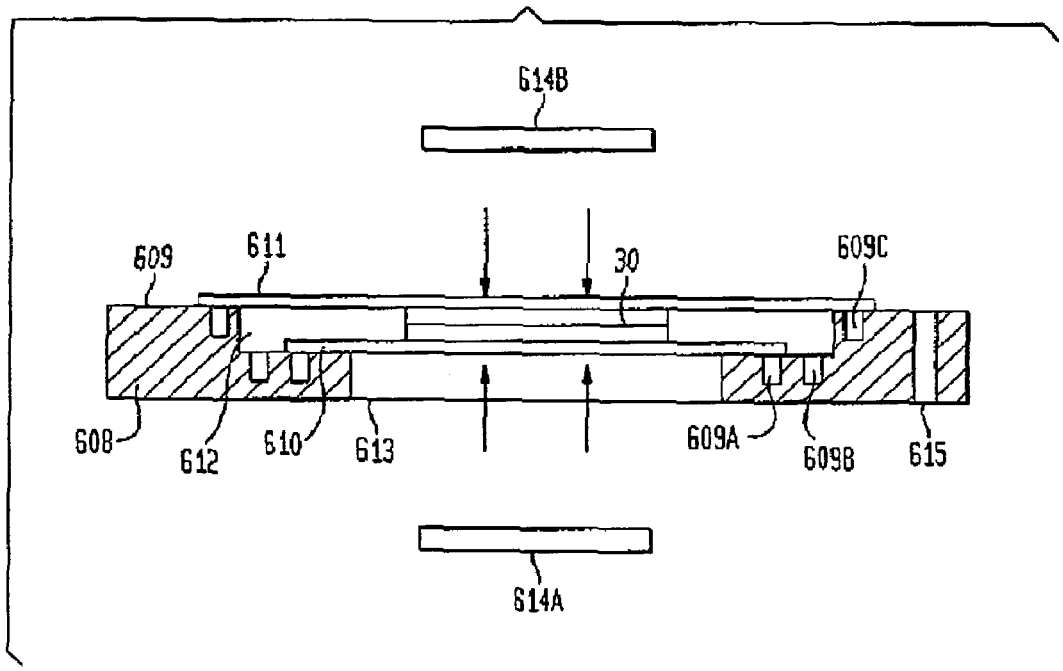
Figure 7B:
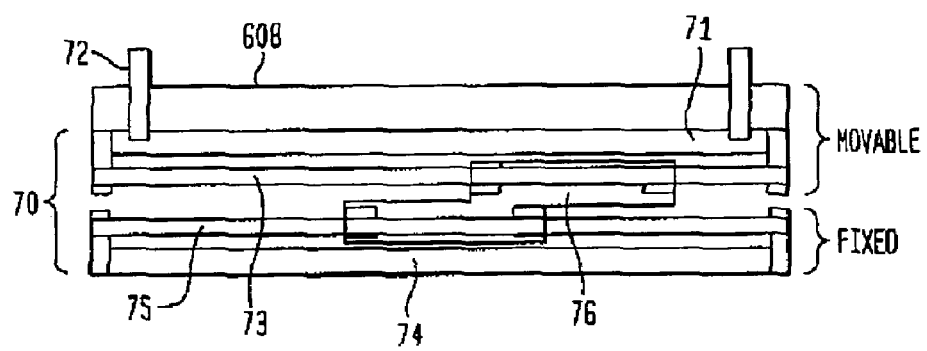
Figure 7C:
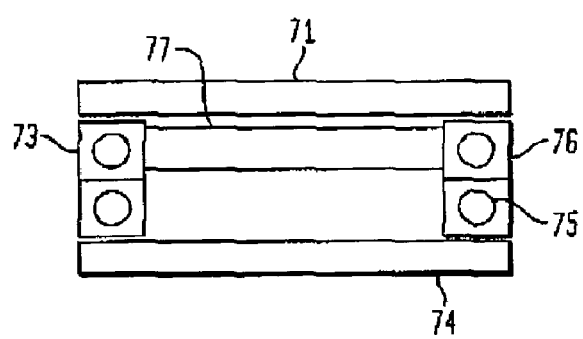

FIGS. 7A, 7B and 7C illustrate in greater detail advantageous assembly stage apparatus useful, for example, in the embodiment of FIG. 6F. FIG. 7A is a schematic cross section of an assembly stage 608 comprising a rigid frame 609 including an assembly support 610 and a flexible sealing cover 611 overlying assembly 30.

The frame 609 advantageously includes a plurality of vacuum ports 609A, 609B, 609C to assist in sealing and a plurality of pressure equalization apertures 615 to assist in equalizing pressure on opposite sides. The frame may include a cavity 612 and a support member 610 for receiving and supporting assembly 30, as well as flexible sealing cover 611 overlying assembly 30. In this arrangement, support member 610 can be a flexible material that can be sealingly engaged to the frame 609 by drawing vacuum through port 609A. Advantageously wire supports (not shown) underlay member 610 for further support. Flexible sealing cover 611 can be engaged to frame 609 by drawing vacuum through port 609C. The cavity 612 containing the assembly 30 is thereby sealed and can be evacuated through port 609B.

The frame 609 can conveniently include an underlying region 613 that is either transparent (e.g. glass) or a second cavity region to permit illumination of the assembly bottom by a source 614A of radiation such as UV or infrared (thermal) radiation. In such instance, support member 610 should also be transparent to the radiation. Similarly, a source of radiation 614B can be provided to illuminate the top of assembly 30 through a flexible cover 611 that is transparent. The radiation sources will typically be part of the chamber or transmit through transparent chamber windows (not shown).

The support 610 and cover 611 can also be sealingly engaged with the frame 609 by approaches other than vacuum, e.g. by mechanical clamp or electrostatic force.

In using the assembly stage 608, it is convenient that the assembly 30 be loaded into the stage outside the confines of the pressure chamber. To this end, it is advantageous to provide arrangements for moving a loaded stage into the chamber and from the chamber after fluid pressure imprinting. FIGS. 7B and 7C are schematic side and end views of loading apparatus which, when fixed within the chamber (e.g. the lower cylinder 607B of FIG. 6F), permits the assembly stage 608 to be loaded outside the chamber and then to be moved within the chamber. In essence, the loading apparatus 70 comprises a movable top plate 71 having vertical guiding rods 72 and horizontal guiding rods 73. A fixed bottom plate 74 having corresponding horizontal guiding rods 75 is mounted within the chamber (e.g. lower cylinder) and the top plate guiding rods 73 are slidably coupled to the bottom plate guiding rods by sliding blocks 76. The position of the slide blocks can be maintained by a connecting plate 77.

In operation, the mating cylinders are axially separated, the top plate 71 is moved laterally out from the region enclosed by the cylinders, and a loaded assembly stage is placed on the top plate, aligned by registration of the plate vertical guide rods with apertures in the stage. The top plate 71 is then moved back into the region between the cylinders which are sealingly closed to form a pressure chamber that includes the assembly 30.

It is advantageous to include within the pressure chamber 607 apparatus for cooling the assembly 30 after imprinting, especially if the moldable surface is heated to softened for imprinting. This can be readily accomplished by mounting gas nozzles or fans (not shown) for directing cooling gas over the top over 611 and/or the support number 610.

FIG. 7D is a side elevation depiction of an assembly stage 608 aligned with a movable top plate 71 by vertical guiding rods 72. This assembly stage 608 includes an elastomeric O-ring 625 to seal with cylinder 607A (not visible) and a plurality of apertures 626 peripheral to the transparent sealing cover 611 to assure that during imprinting pressure is equalized between the top and bottom of the stage 608. In this exemplary embodiment the cover 611 as well as flexible support member 610 (not visible) are sealed to the rigid frame 609 by annular channels 627 in communication with respective vacuum ports 609A, 609C (not visible).

Figure 8A:
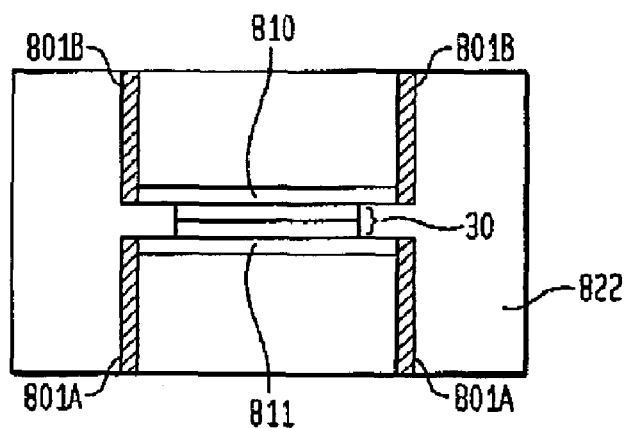
FIGS. 8A, 8B and 8C schematically illustrate modifications of the apparatus to provide alternative sealing arrangements.

FIG. 8A illustrates a modification of the FIG. 6F apparatus wherein the support and cover comprise flexible membranes 810 and 811. Membrane 810 and chamber wall 801B form a first chamber; membrane 811 and wall 801A form a second chamber. Application of fluid pressure to the interior of these two chambers presses the mold and moldable surface together. The above arrangement (including assembly 30, membranes 810, membranes 811, wall 801A and 801B) can alternatively be put into a larger chamber 822. Vacuum may be applied to chamber 822 to evacuate the air trapped between the mold and moldable surfaces before imprint. After imprint, differential fluid pressure may subsequently be applied to 822 and the two chambers to separate the mold from the moldable surface. Alternatively membrane 811 and wall 801A may be replaced with a solid supporting surface. In this case, fluid pressure need only be applied from one side of the assembly, e.g. via the chamber formed by wall 801B and membrane 810.

Figure 8B:
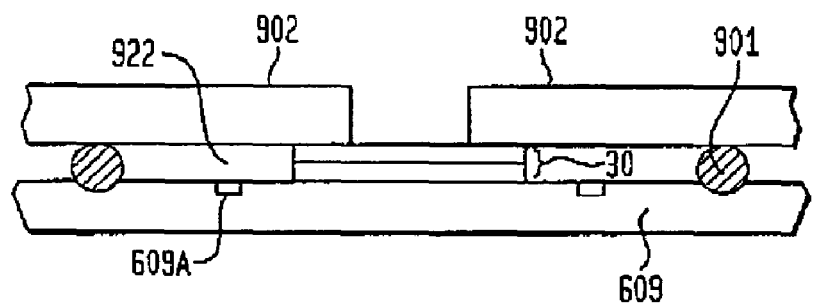

FIG. 8B illustrates an alternative sealing approach in which the assembly 30 is sealed by a sealing O-ring 901 between the substrate frame 609 and the mold frame 902. In this sealing arrangement, the cavity 922 can be evacuated via vacuum port 609A.

Figure 8C:
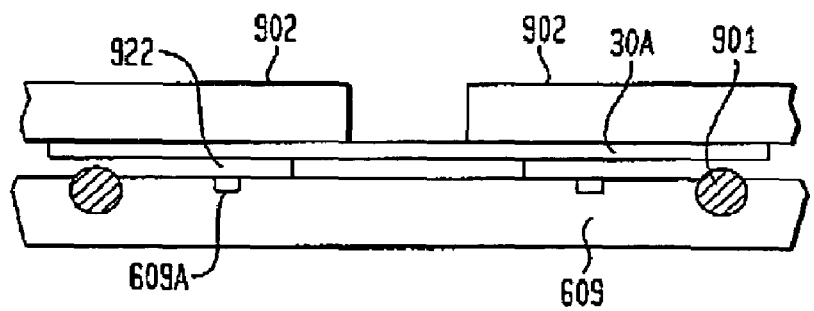

FIG. 8C illustrates an alternative sealing approach in which the assembly 30 is sealed by a sealing O-ring 901 between the mold 30A and the substrate frame 609. This arrangement, the cavity 922 can be evacuated via vacuum port 609A.

Figure 9A:
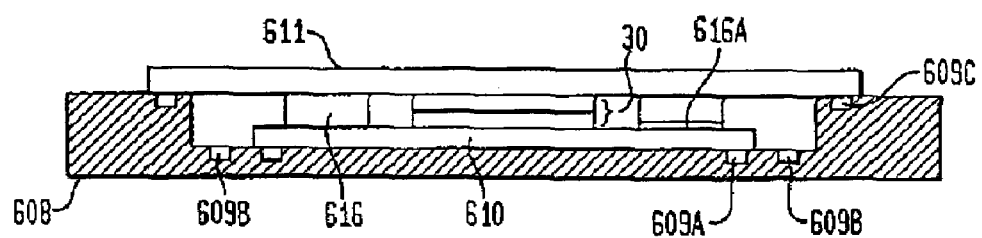
FIGS. 9A and 9B show modifications of the apparatus to improve vacuum for small samples.
Figure 9B:
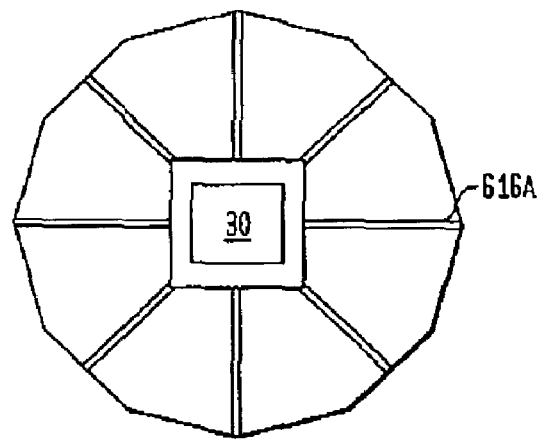

Referring back to FIG. 7A, upon vacuum evacuating of cavity 612, the membranes 610 and 611 will bend to the cavity 612 under the atmosphere pressure. If the size of the mold and substrate is substantially smaller than that of the membranes 610 and 611, the two membranes 610 and 611 may contact with each other and prevent continue further evacuating of air between the mold and moldable surface, causing an unsuccessful imprint. A disk, having similar or same thickness as the total thickness of the substrate and mold, may be used to solve the problem. FIG. 9A shows how the disk can be placed to help improving the vacuum between the mold and moldable surface. On the surface of disk 616 are etched vacuum grooves 616A. They are deep enough so that the membrane 610 can't seal them. FIG. 9B illustrates the top view of the disk with a center opening, where the assemble 30 can be placed into. The disk materials could be ceramic, glass or metal. The grooves 616A may also be etched on the top surface of the disk adjacent to membrane 611 or inside the material itself. They may be etched or machined. 616 can have circular, square, rectangular or other irregular outside or inside shapes.

Alternatively, the disk can also be placed in the apparatus shown in FIG. 8C when the size of substrate 30B is much smaller than that of mold 30A. The disk has a similar or same thickness as that of substrate 30B. It will be placed underneath mold 30A with substrate 30B placed in the center opening hole. The disk prevents mold 30A from bending to the cavity 922 therefore achieving a more uniform imprint between the mold and moldable surface.

In some applications such as high volume production or step-and-repeat nanoimprint, an effective in-situ separation of mold from moldable surface is required after imprint. This can be done conveniently by sending fluid flow in between the mold and moldable surface, FIGS. 10A through 10D illustrate some of these ways.

Figure 10A:
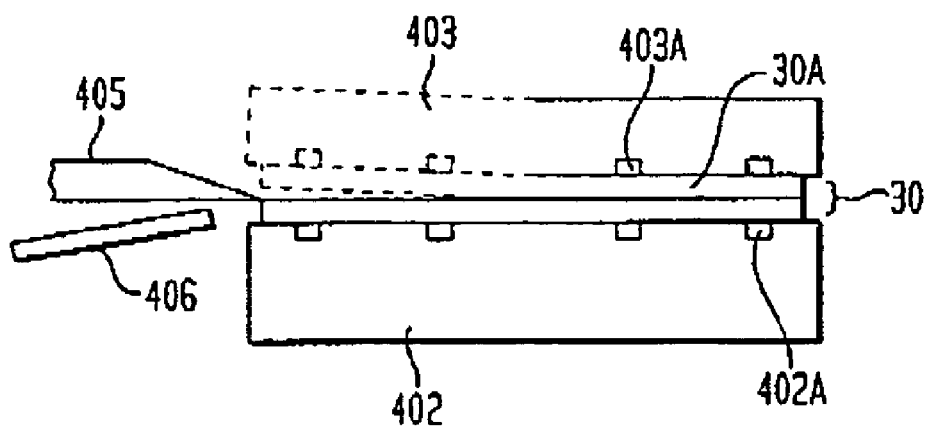
FIGS. 10A through 10D illustrate alternative arrangements to facilitate separation of the mold and the substrate after imprinting.

FIG. 10A shows a separation arrangement in which assemble 30 is placed between mold stage 403 and substrate stage 402. Mold 30A is hold to 403 by vacuum port 403A; substrate 30B is hold to 402 by vacuum port 402A. A sharp edge 405 is inserted between the edge of 30A and 30B to bend them slightly and separate them on the edge. Nozzle 406 then blows the fluid pressure between the separation on the edge, separating 30A and 30B completely.

Figure 10B:
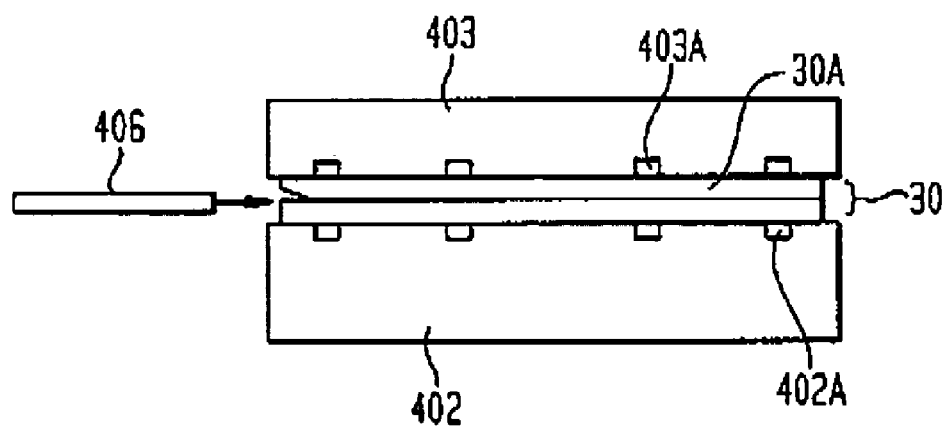

FIG. 10B shows a different separation arrangement where the edge of 30A is etched to form a notch. Nozzle 406 directly blows fluid pressure into the notch. Under the guidance of the notch, the fluid can than diffuse between the mold and moldable surface and separate them completely.

Figure 10C:
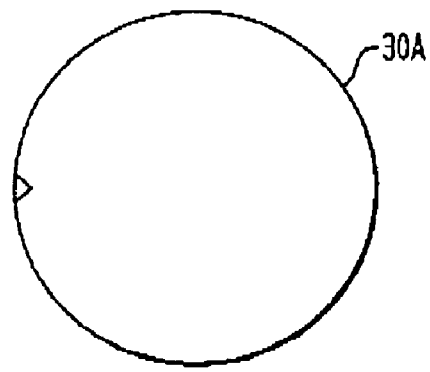

FIG. 10C shows the top view of the etched notch on the surface of 30A. The notch can be microfabricated or machined. Alternatively the notch can be on the substrate surface as well. The notch can also have different shapes.

Figure 10D:
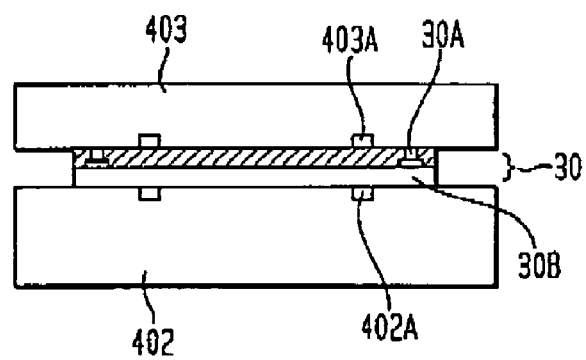

FIG. 10D illustrates a separation arrangement where fluid flow can be inserted by the channels 301 already formed on the mask 30A. Different channel configurations may be used. Alternatively, the fluid flow may also be introduced from the side of 30A and 30B by a nozzle, as shown in FIG. 10B.

Figure 11:
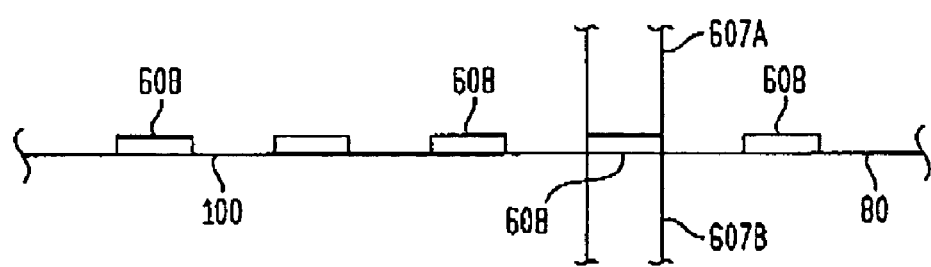
FIG. 11 schematically shows an advantageous arrangement to employ the apparatus in mass production.

In an alternative arrangement schematically illustrated in FIG. 11, one or more assembly stages 608 can be mounted on a laterally movable belt 100. The belt moves successive stages between the cylinders 607A, 607B, the cylinders move toward each other into sealing engagement with each stage or the belt, the chamber formed by the cylinders is pressurized for imprinting and then depressurized and opened. The cycle can be repeated for each assembly stage on the belt. This arrangement is particularly suitable for high volume production.

It is understood that the above-described embodiments are illustrative of only a few of the many possible specific embodiments, which can represent applications of the invention. Numerous and varied other arrangements can be made by those skilled in the art without departing from the spirit and scope of the invention.

We claim:

1. An apparatus for performing imprint lithography on a substrate having a moldable surface comprising:
   a pressure chamber for receiving pressurized fluid;
   an assembly of a mold and the substrate, the mold having a molding surface with a plurality of protruding features for imprinting the moldable surface of the substrate, the mold positioned with the molding surface adjacent the moldable surface; and
   an assembly stage for supporting the assembly in the chamber and sealing the interface between the molding surface and the moldable surface from the chamber, the assembly stage comprising a support member for supporting the assembly and a flexible sealing cover for sealing the assembly from the chamber;
   the flexible sealing cover sealing against the support member by evacuation of fluid between the cover and the support member; and
   the molding surface pressed into the moldable surface by the introduction of pressurized fluid into the pressure chamber.

2. The apparatus of claim 1 wherein the support member comprises a flexible sealing support member.

3. The apparatus of claim 1 wherein the stage comprises a rigid frame.

4. The apparatus of claim 3 wherein the rigid frame supports the support member.

5. The apparatus of claim 3 wherein the rigid frame supports the flexible sealing support member.

6. The apparatus of claim 5 wherein the flexible sealing support member is sealed against the rigid frame by evacuation of fluid between the frame and the support.

7. The apparatus of claim 3 wherein the rigid frame includes a cavity for disposition of the assembly of mold and substrate.

8. The apparatus of claim 7 wherein the flexible sealing cover is disposed overlying the cavity.

9. The apparatus of claim 8 wherein the flexible sealing cover is sealed against the rigid frame by evacuation of fluid between the frame and the cover.

10. The apparatus of claim 1 wherein the support is transparent to UV or thermal radiation.

11. The apparatus of claim 1 wherein the sealable cover is transparent to UV or thermal radiation.

12. The apparatus of claim 1 wherein the pressure chamber comprises a pair of cylinders that seal against the stage.

13. The apparatus of claim 12 wherein the stage is laterally movable from a position outside the cylinders into position between the cylinders.

14. The apparatus of claim 1 including an element to cool the assembly.

15. The apparatus of claim 1 including sensors to monitor the temperature of the assembly stage.

16. The apparatus of claim 1 wherein the molding surface comprises protruding features and recessed features for molding a pattern having at least one feature with a minimum lateral dimension of less than 200 nanometers.

17. The apparatus of claim 16 wherein the mold depth between a protruding feature of the molding surface and a recessed feature is less than 250 nanometers.

18. The apparatus of claim 17 wherein the mold depth is in the range 5-250 nanometers.

19. The apparatus of claim 1 wherein the molding surface includes a layer of release material.

20. The apparatus of claim 19 wherein the release material is bonded to the molding surface.

21. The apparatus of claim 1 wherein the molding surface comprises a pattern for molding at least one feature with a minimum lateral dimension of less than 25 nm.

22. The apparatus of claim 1 wherein at least a portion of a protruding feature of the molding surface has bonded thereto a release material comprising an inorganic linking group bonded to a molecular chain having release properties.

23. The apparatus of claim 19 wherein the layer of release material is discontinuous.

* * * * *